United States Patent
Yu et al.

(10) Patent No.: US 12,283,440 B2
(45) Date of Patent: Apr. 22, 2025

(54) KEYBOARD SWITCH WITH REMOVEABLE SUPPORTING MEMBER

(71) Applicant: Trantek Electronics Co., Ltd., Huizhou (CN)

(72) Inventors: Zhengming Yu, Huizhou (CN); Jianbing Peng, Huizhou (CN)

(73) Assignee: Trantek Electronics Co., Ltd., Huizhou (CN)

( * ) Notice: Subject to any disclaimer, the term of this patent is extended or adjusted under 35 U.S.C. 154(b) by 175 days.

(21) Appl. No.: 18/097,248

(22) Filed: Jan. 15, 2023

(65) Prior Publication Data

US 2023/0170165 A1 Jun. 1, 2023

Related U.S. Application Data

(63) Continuation-in-part of application No. PCT/CN2020/110373, filed on Aug. 21, 2020.

(30) Foreign Application Priority Data

Jul. 31, 2020 (CN) .......................... 202010758891.2

(51) Int. Cl.
*H01H 13/14* (2006.01)
*H01H 3/12* (2006.01)
(Continued)

(52) U.S. Cl.
CPC .............. *H01H 13/14* (2013.01); *H01H 3/12* (2013.01); *H01H 13/023* (2013.01);
(Continued)

(58) Field of Classification Search
CPC ....... H01H 2001/58; H01H 2001/5805; H01H 2003/12; H01H 2013/00; H01H 2013/02;
(Continued)

(56) References Cited

U.S. PATENT DOCUMENTS

| 4,467,160 A | 8/1984 | Murmann et al. |
| 2007/0246337 A1* | 10/2007 | Verdu .................. H01H 13/023 |
| | | 200/314 |

FOREIGN PATENT DOCUMENTS

| CN | 204516650 U | 7/2015 |
| CN | 208922957 U | 5/2019 |
| CN | 110352468 A | 10/2019 |

OTHER PUBLICATIONS

SIPO, International Search Report, PCT Patent Application No. PCT/CN2020/110373.

* cited by examiner

*Primary Examiner* — Anthony R Jimenez
(74) *Attorney, Agent, or Firm* — Hemisphere Law, PLLC; Zhigang Ma

(57) ABSTRACT

The present invention relates to a keyboard switch including a base, a supporting member, a spring, a button and an upper cover. The supporting member includes a first plate connected to the base to seal the opening, a tube extending substantially perpendicularly from a surface of the first plate, and a plurality of blocks extending substantially perpendicularly from the first plate and configured around the tube. There is a gap between the tube and the plurality of blocks. The base and the supporting member may be made of different materials and colors from the base, so that the supporting member may have a good light-shielding performance and durability; and the base may be made of a collocation of different materials and colors, and has a wide design space.

12 Claims, 13 Drawing Sheets

(51) Int. Cl.
*H01H 13/02* (2006.01)
*H01H 13/04* (2006.01)
*H01H 13/10* (2006.01)

(52) U.S. Cl.
CPC ............ *H01H 13/04* (2013.01); *H01H 13/10* (2013.01); *H01H 2219/054* (2013.01); *H01H 2235/01* (2013.01)

(58) Field of Classification Search
CPC ........... H01H 2013/04; H01H 2013/50; H01H 2013/525; H01H 2027/00; H01H 2221/066; H01H 2221/076; H01H 2223/00; H01H 2223/014; H01H 2223/03; H01H 2233/00; H01H 2233/002; H01H 2233/004; H01H 17/94; H01H 2219/037; H01H 2219/002; H01H 2219/054; H01H 2235/01; H01H 2215/028; H01H 2221/023; H01H 2221/056; H01H 2221/08; H01H 9/16; H01H 3/00; H01H 3/02; H01H 3/12; H01H 9/02; H01H 13/00; H01H 13/02; H01H 13/14; H01H 13/12; H01H 13/023; H01H 13/04; H01H 13/10; H01H 13/705; H01H 13/78; H01H 13/83; H01H 13/84; H01H 13/85; H01H 13/86; H01H 13/50; H01H 13/52; H01H 13/66; H01H 13/70; H01H 13/7057
USPC ........................................................ 200/314
See application file for complete search history.

KEYBOARD SWITCH WITH REMOVEABLE SUPPORTING MEMBER

CROSS-REFERENCE TO RELATED APPLICATION

The present application claims priority of China Patent Application No. 202010758891.2, filed on Jul. 31, 2020, and PCT Patent Application No. PCT/CN2020/110373, filed on Aug. 21, 2020, which are incorporated herein by reference.

BACKGROUND OF THE INVENTION

1. Technical Field

The present invention relates to the field of keyboard switches, and more particularly to a keyboard switch with a split-type base.

2. Description of Related Art

Keyboard switch is a main component of mechanical keyboard. The quality of keyboard switch has a great impact on the keyboard. With the popularity of mechanical keyboards, people also put forward more and more requirements for keyboard switch. For example, the color of the shell of keyboard switch is more and more demanding. It is hoped that the shell can have a variety of colors. At the same time, it is also required that the components of keyboard switch sliding with buttons have better wear resistance. However, the current keyboard switch cannot achieve the two requirements at the same time.

Specifically, with regard to the existing keyboard switch, the optical channel and the base are of an integral structure. Since the optical channel needs to cooperate with the light blocking column on the button and the photoelectric correlated cell to trigger the switch function, and the button is movable in the optical channel, the button needs to have a high wear-resistant property, and needs to be made of a material with good wear-resistance. The light blocking column in the button needs to be made of a light-shielding material. As with the base of the optical channel, the transparent material cannot be used, and the base cannot have both color diversity and durability. The existing mechanical shaft structure has a supporting member and a base as an integral structure, and the supporting member needs to contact and rub the button for a long time, so the supporting member needs to have a high wear-resistant property. a second member and a first member made of a metal material are fixed on the base, and both the second member and the first member extend to the base as a pin for fixing the solder, so the supporting member needs to be made of a material with good wear resistance and high-temperature resistance. However, the existing transparent materials are mostly PC materials, and PC is not wear-resistant and not high-temperature-resistant, and therefore the base cannot have both colour diversity and durability.

BRIEF DESCRIPTION OF THE SEVERAL VIEWS OF THE DRAWINGS

The foregoing and other exemplary purposes, aspects and advantages of the present invention will be better understood in principle from the following detailed description of one or more exemplary embodiments of the invention with reference to the drawings, in which.

DETAILED DESCRIPTION OF THE INVENTION

Figure 1:
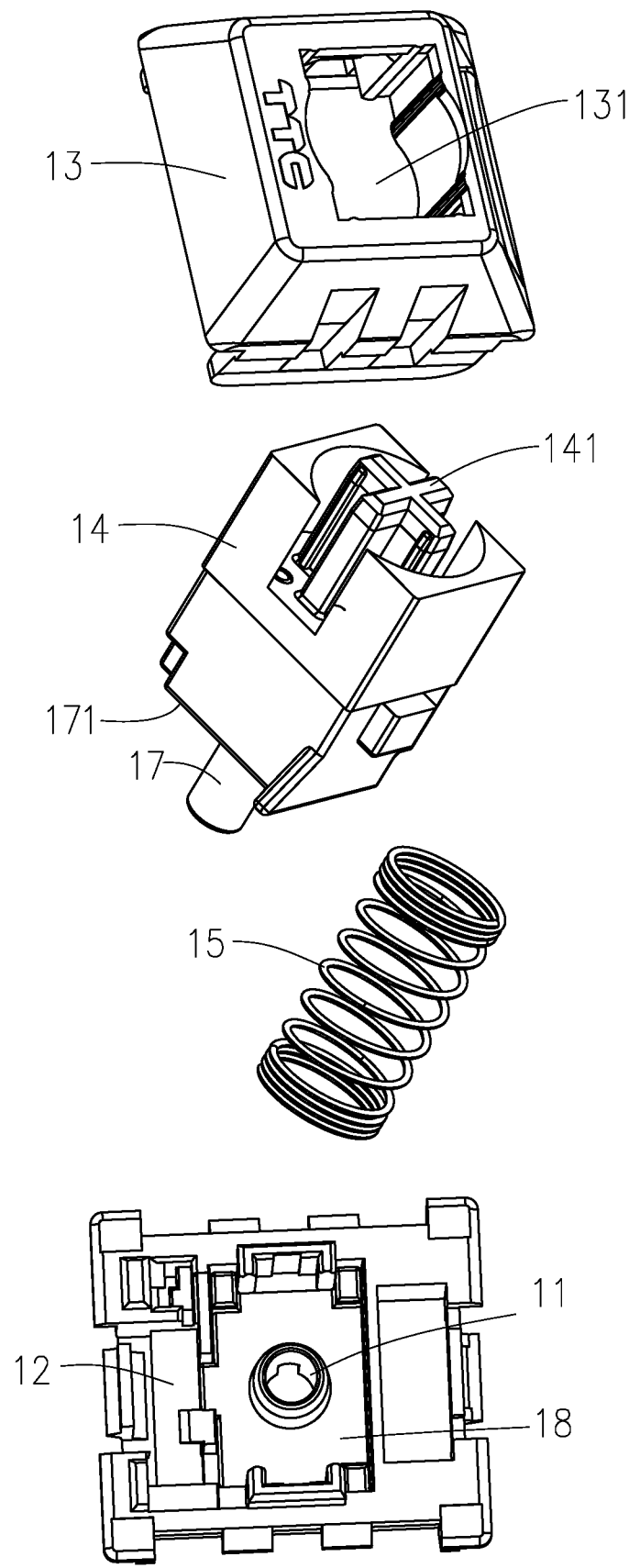
FIG. 1 is an exploded view of a keyboard switch in accordance with a first embodiment of the present invention.

The invention will now be described in detail through several embodiments with reference to the accompanying drawings.

First Embodiment

With reference to FIGS. 1-4, a keyboard switch in accordance with a first embodiment of the present invention mainly includes a base 12, an upper cover 13 connected to the base 12, a supporting member 18 provided with a tube 11, a spring 15 sleeved on the tube 11, a button 14, and a control signal generating assembly 19.

The base 12 defines an opening 16 in a center of the base 12. The supporting member 18 connected to the base 12. The upper cover 13 connected to the base 12 to form a receiving space used to receiving the spring 15, the button 14 and a part of the supporting member 18. The upper cover 13 defines a through hole 131 permitting an operating head 141 of the button 14 to protrude out of the upper cover 13. The button 14 further includes a second plate 171 used to pressed against an upper end of the spring 15, and a post 17 used to be inserted in the tube 11.

The supporting member 18 mainly includes a first plate 181 connected to the base 12 to seal the opening 16, the tube 11 extending substantially perpendicularly from a top surface of the first plate 181 and several (three in the embodiment) blocks 182 extending substantially perpendicularly from the top surface of the first plate 181. A through hole 111 of the tube 11 runs through the first plate 181, therefore an end of the post 17 is capable of passing the through hole 111 and being exposed out of the through hoe 111. The blocks 182 is located around the tube 11 and there is a gap 185 between the tube 11 and the blocks 182. A lower part of the spring 15 which is sleeved on the tube 11 is received in the gap 185. Therefore, a movement of the spring 15 is limited by the blocks 182, the keyboard switch is more stable when the button 14 is pressed and released. The supporting member 18 may also connected to the base 12 by rivets mounted in holes formed in the blocks 182 and the base 12, thus the blocks 182 make the connection between the supporting member 18 and the base 12 easier. When a distribution of the blocks 182 is asymmetrical, the blocks 182 can also be used as an indication of the installation direction of the supporting member 18.

The control signal generating assembly 19 is used for generating a switching signal when the button 14 is pressed, and is connected to the supporting member 18 in the embodiment. In the embodiment, the control signal generating assembly 19 includes a pair of phototubes 191, 192. One (emitter) of the phototubes 191, 192 is used for emitting light to the other one (collector), and the other one (collector) is used to receiving the light and outputting corresponding signals which are considered as the switching signal. The phototubes 191, 192 are fixed to a bottom surface of the first plate 181 of the supporting member 18, and are spaced opposite each other across the through hole 111 of the tube 11.

The supporting member 18 further includes two walls 183 extending substantially perpendicularly from the other surface of the first plate 18. The two walls are also spaced opposite each other across the through hole 111, and two slots 184 are defined between the two walls 183. That is, the two walls 183 are set on two sides of the through hole 111 of the tube 11. The two walls 183 are lightproof, and the two phototubes 191, 192 face each other through the slots 184 when the button 14 is unpressed. At least the end of the post 17 is also lightproof, when the button 14 is pressed, the end of the post 17 passes through the through hole 111 and is exposed out of the through hoe 111, stands between the phototubes 191, 192, thus other one (collector) of the phototubes 191, 192 can't receive the light. A control circuit of a keyboard which having the keyboard switch of the embodiment may judge whether the keyboard switch is pressed by the signals outputted by the control signal generating assembly 19.

The supporting member 18 further includes at least one protruding part 186 extending outwardly from a side of the first plate 181, and the base 12 further includes at least one corresponding socket 121 for receiving the at least one protruding part 186. In the embodiment, the blocks 182 may also be considered as protruding parts which extend outwardly from the sides of the first plate 181, and the base 12 has corresponding sockets 122 for receiving the blocks 182. The supporting member 18 may be fixed to the base 12 steadily based on the protruding part 186, blocks 182 and the sockets 121, 122.

In the embodiment, the button 14 cooperates with the tube 11 of the supporting member 18 to switch states of the keyboard switch. The spring 15 is used for driving the button 14 to return to an original position. In the present embodiment, the phototubes 191, 192 are mounted opposite to each other, and in other embodiments, the phototubes may be mounted in light refraction way. The tube 11 is located on the supporting member 18, and the supporting member 18 is connected with the base 12 in a split-type manner.

The button 14 moves up and down to block the phototubes and not block the phototubes, therefore the two states of the keyboard switch are realized, respectively.

The supporting member 18 and the base 12 are two independent components, so the supporting member 18 and the base 12 may be made of different materials. Since the tube 11 and the button 14 need long-term contact and friction, and the tube 11 has a greater demand for wear resistance and special optical property, the supporting member 18 may be made of materials with wear resistance and good light-shielding property, while the base 12 does not have high requirements for wear resistance and light-shielding property and may be made of other materials. In addition, since the base 12 is used as an appearance, there is a demand for aesthetics. Since the base and the supporting member may be separated from each other independently, the base and the supporting member may be colored in different colors, and may even be made transparent according to needs, thus greatly enriching the space for selecting the design of the shaft body.

Figure 2:
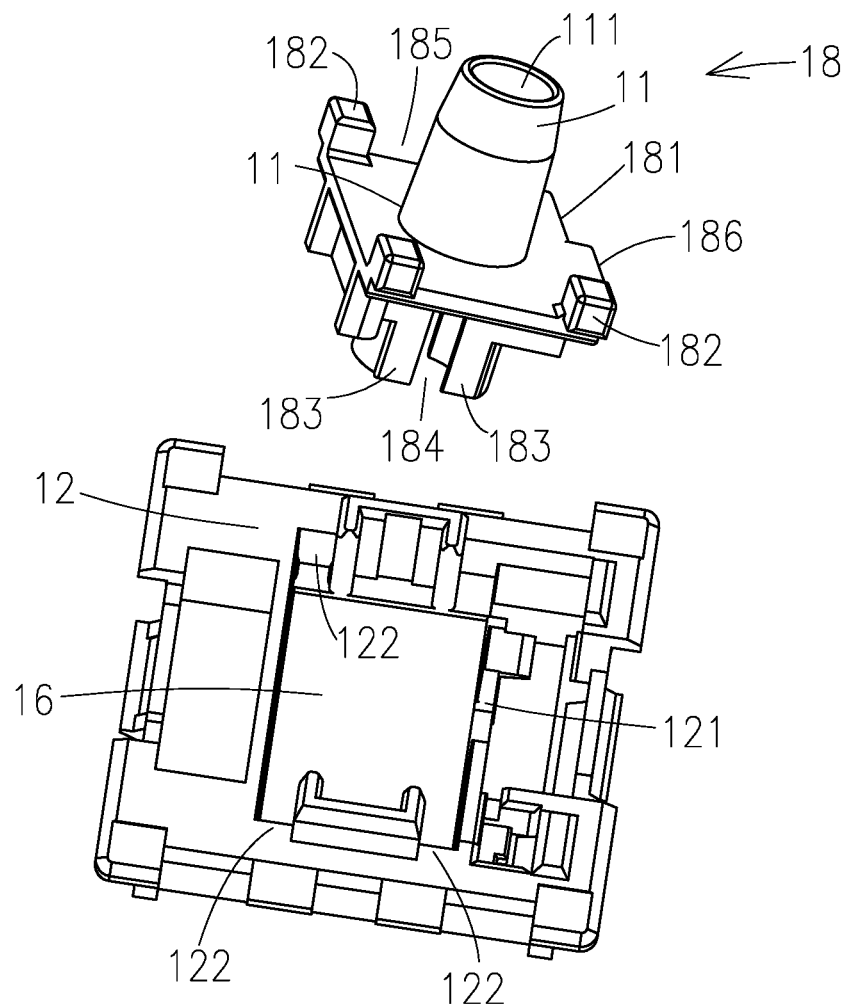
FIG. 2 is perspective views of a supporting member and a base in accordance with the first embodiment of the present invention.
Figures 3, 4:
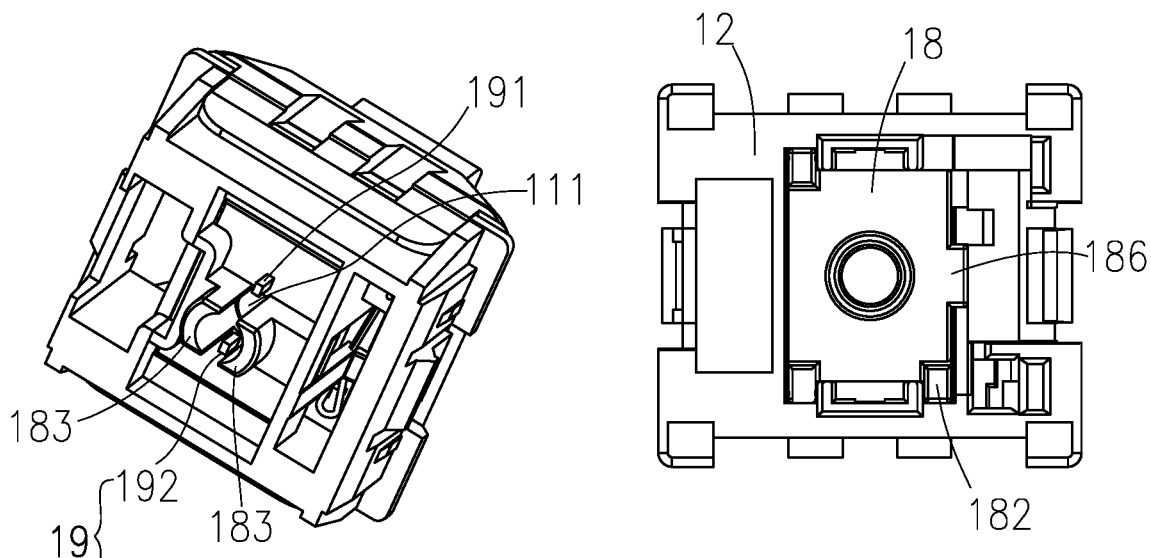
FIG. 3 is a perspective view of the keyboard switch in accordance with the first embodiment of the present invention.
FIG. 4 is a structural view of the supporting member and the base fixed together in accordance with the first embodiment of the present invention.
Figure 5:
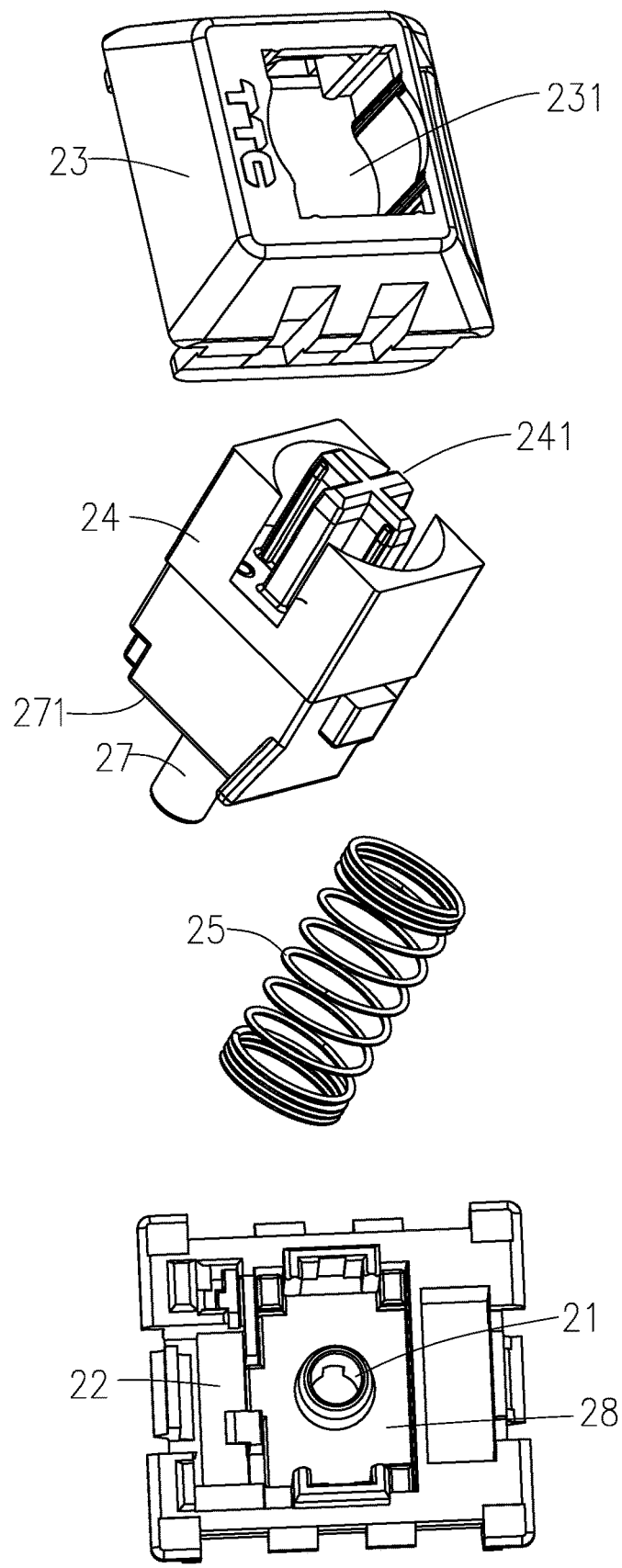
FIG. 5 is an exploded view of a keyboard switch in according accordance with a second embodiment of the present invention.

As shown in FIG. 2 to FIG. 4, the supporting member 18 is hold tightly within the opening 16 of the base 12. In other embodiments, the supporting member 18 may be connected to the base 12 in a mortise-and-tenon manner, the supporting member may be provided with a tenon, the base may be provided with a mortise, or the supporting member may be provided with a mortise, and the base may be provided with a tenon. In other embodiments, the supporting member may be in an interference connection with the base, and the supporting member and the base may be clamped with each other. In other embodiments, the supporting member may be connected to the base by glue.

Second Embodiment

With reference to FIGS. 5-8, a keyboard switch in accordance with a second embodiment of the present invention mainly includes a base 22, an upper cover 23 connected to the base 22, a supporting member 28 provided with a tube 21, a spring 25 sleeved on the tube 21, a button 24, and a control signal generating assembly 29.

The base 22 defines an opening 26 in a center of the base 22. The supporting member 28 connected to the base 22. The upper cover 23 connected to the base 22 to form a receiving space used to receiving the spring 25, the button 24 and a part of the supporting member 28. The upper cover 23 defines a through hole 231 permitting an operating head 241 of the button 24 to protrude out of the upper cover 23. The button 24 further includes a second plate 271 used to pressed against an upper end of the spring 25, and a post 27 used to be inserted in the tube 21.

The supporting member 28 mainly includes a first plate 281 connected to the base 22 to seal the opening 26, the tube 21 extending substantially perpendicularly from a top surface of the first plate 281 and several (three in the embodiment) blocks 282 extending substantially perpendicularly from the top surface of the first plate 281. A through hole 211 of the tube 21 runs through the first plate 281, therefore an end of the post 27 is capable of passing the through hole 211 and being exposed out of the through hoe 211. The blocks 282 is located around the tube 21 and there is a gap 285 between the tube 21 and the blocks 282. A lower part of the spring 25 which is sleeved on the tube 21 is received in the gap 285. Therefore, a movement of the spring 25 is limited by the blocks 282, the keyboard switch is more stable when the button 24 is pressed and released. The supporting member 28 may also connected to the base 22 by rivets mounted in holes formed in the blocks 282 and the base 22, thus the blocks 282 make the connection between the supporting member 28 and the base 22 easier. When a distribution of the blocks 282 is asymmetrical, the blocks 282 can also be used as an indication of the installation direction of the supporting member 18.

The control signal generating assembly 29 is used for generating a switching signal when the button 24 is pressed, and is connected to the supporting member 28 in the embodiment. In the embodiment, the control signal generating assembly 29 includes a pair of phototubes 291, 292. One (emitter) of the phototubes 291, 292 is used for emitting light to the other one (collector), and the other one (collector) is used to receiving the light and outputting corresponding signals which are considered as the switching signal. The phototubes 291, 292 are fixed to a bottom surface of the first plate 281 of the supporting member 28, and are spaced opposite each other across the through hole 211 of the tube 21.

The supporting member 28 further includes two walls 283 extending substantially perpendicularly from the other surface of the first plate 28. The two walls are also spaced opposite each other across the through hole 211, and two slots 284 are defined between the two walls 283. That is, the two walls 283 are set on two sides of the through hole 211 of the tube 21. The two walls 283 are lightproof, and the two phototubes 291, 292 face each other through the slots 284 when the button 24 is unpressed. At least the end of the post 27 is also lightproof, when the button 24 is pressed, the end of the post 27 passes through the through hole 211 and is exposed out of the through hoe 211, stands between the phototubes 291, 292, thus other one (collector) of the phototubes 291, 292 can't receive the light. A control circuit of a keyboard which having the keyboard switch of the embodiment may judge whether the keyboard switch is pressed by the signals outputted by the control signal generating assembly 29.

The supporting member 28 further includes at least one protruding part 286 extending outwardly from a side of the first plate 281, and the base 22 further includes at least one corresponding socket 221 for receiving the at least one protruding part 286. In the embodiment, the blocks 282 may also be considered as protruding parts which extend outwardly from the sides of the first plate 281, and the base 22 has corresponding sockets 222 for receiving the blocks 282. The supporting member 28 may be fixed to the base 22 steadily based on the protruding part 286, blocks 282 and the sockets 221, 222.

In the embodiment, the button 24 cooperates with the tube 21 of the supporting member 28 to switch states of the keyboard switch. The spring 25 is used for driving the button 24 to return to an original position. In the present embodiment, the phototubes 291, 292 are mounted opposite to each other, and in other embodiments, the phototubes may be mounted in light refraction way. The tube 21 is located on the supporting member 28, and the supporting member 28 is connected with the base 22 in a split-type manner.

The button 24 moves up and down to block the phototubes and not block the phototubes, therefore the two states of the keyboard switch are realized, respectively.

The supporting member 28 and the base 22 are two independent components, so the supporting member 28 and the base 22 may be made of different materials. Since the tube 21 and the button 24 need long-term contact and friction, and the tube 21 has a greater demand for wear resistance and special optical property, the supporting member 28 may be made of materials with wear resistance and good light-shielding property, while the base 22 does not have high requirements for wear resistance and light-shielding property and may be made of other materials. In addition, since the base 22 is used as an appearance, there is a demand for aesthetics. Since the base and the supporting member may be separated from each other independently, the base and the supporting member may be colored in different colors, and may even be made transparent according to needs, thus greatly enriching the space for selecting the design of the shaft body.

Figure 6:
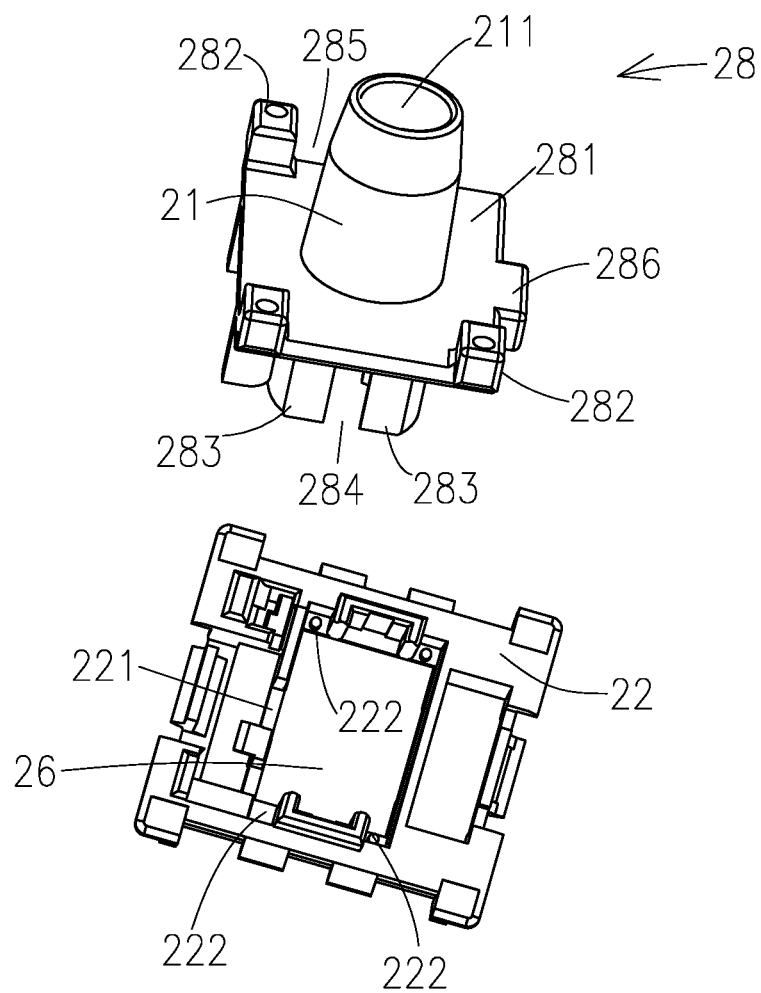
FIG. 6 is perspective views of a supporting member and a base in according accordance with the second embodiment of the present invention.
Figure 7:
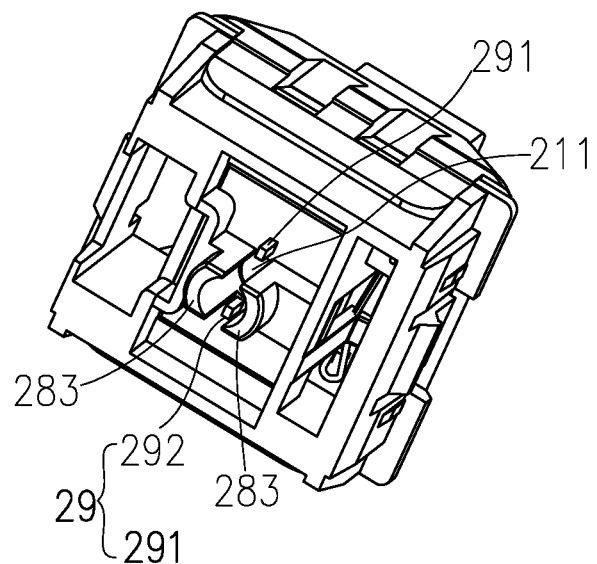
FIG. 7 is a perspective view of the keyboard switch in accordance with the second embodiment of the present invention.
Figure 8:
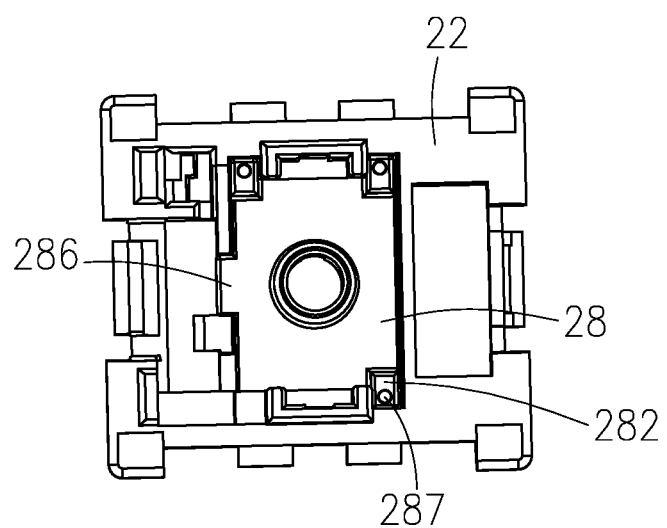
FIG. 8 is a structural view of the supporting member and the base fixed together in according accordance with the second embodiment of the present invention.
Figure 9:
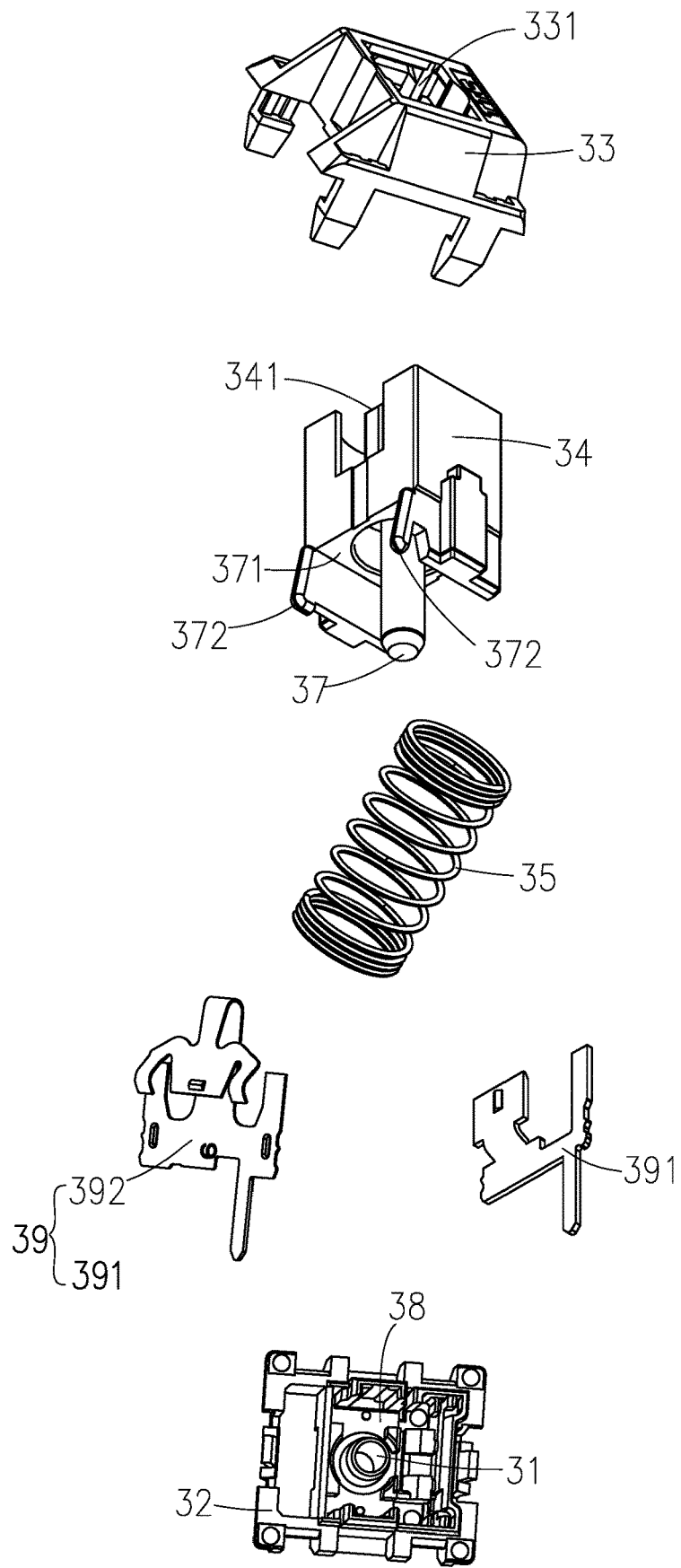
FIG. 9 is an exploded view of the keyboard switch in according accordance with a third embodiment of the present invention.
Figure 10:
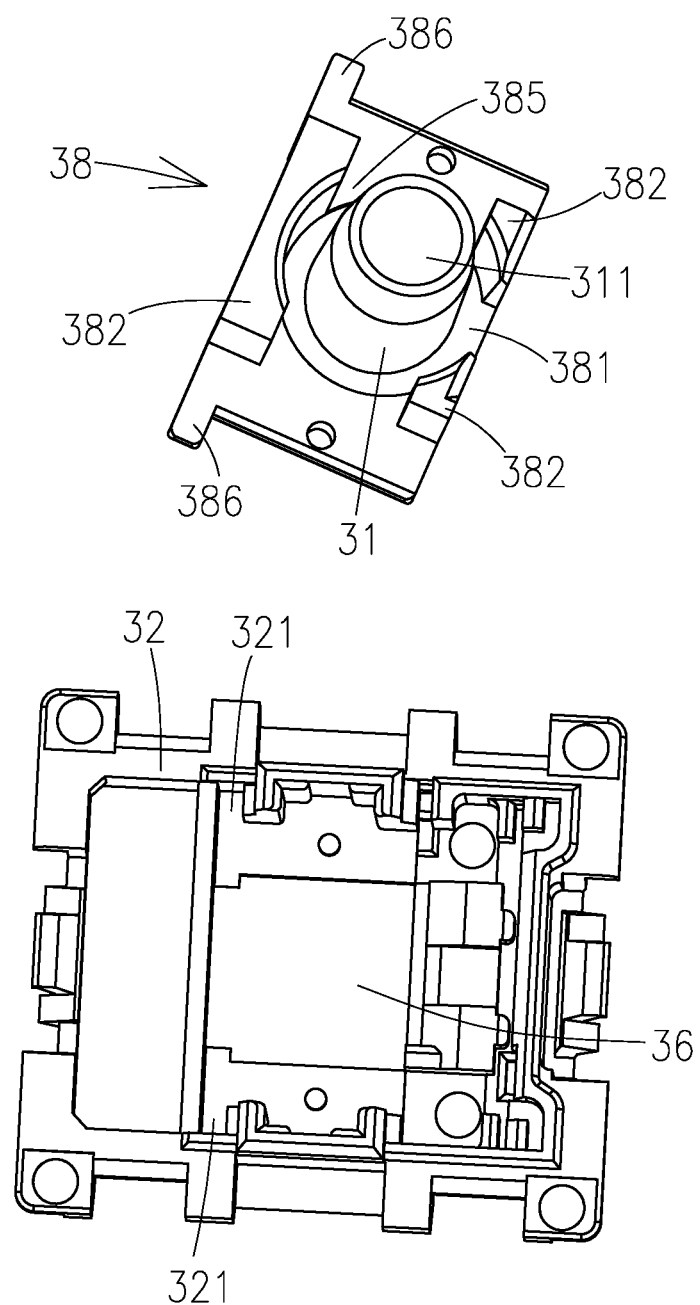
FIG. 10 is perspective views of a supporting member and a base in according accordance with the third embodiment of the present invention.
Figure 11:
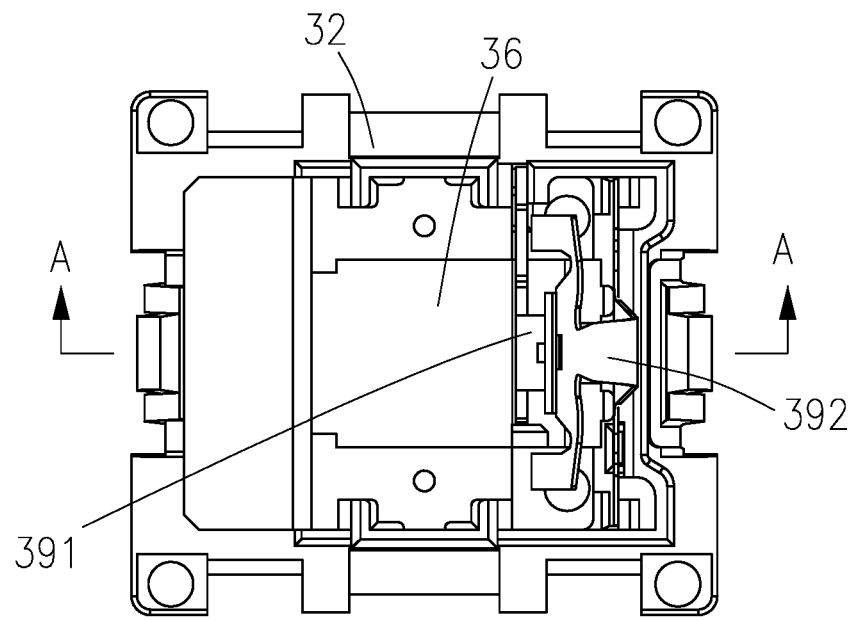
FIG. 11 is a structural view of the base, and a control signal generating assembly fixed together in according accordance with the third embodiment of the present invention.
Figure 12:
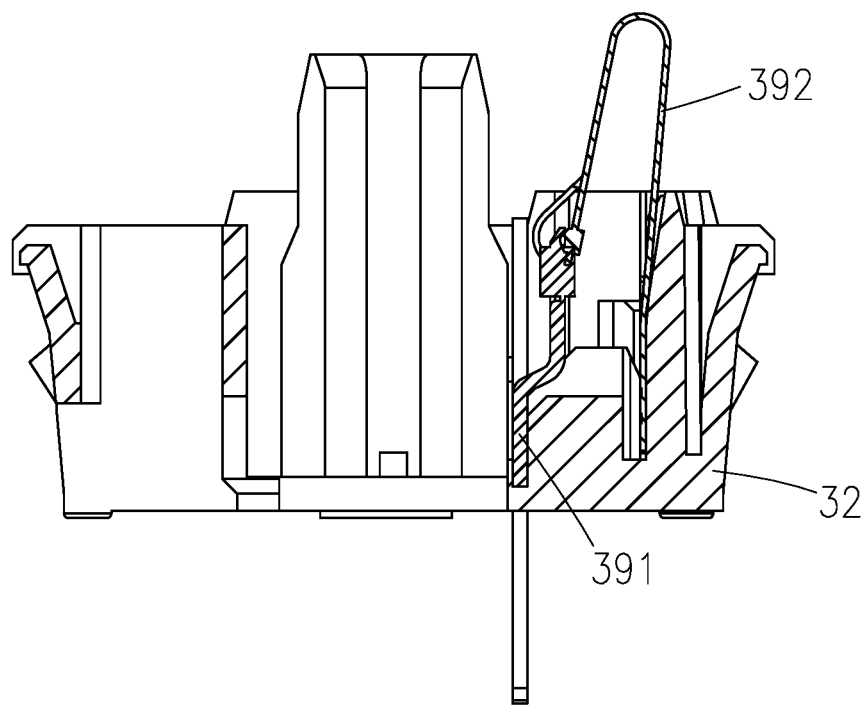
FIG. 12 is a sectional view cutting along a line of A-A of FIG. 11.

As shown in FIG. 6, FIG. 7 and FIG. 8, the supporting member 28 is riveted on the base 22 to seal the opening 26 by rivets 287. The rivets 287 are inserted in holes in the blocks 282 and the sockets 222.

Third Embodiment

With reference to FIGS. 9-14, a keyboard switch in accordance with a third embodiment of the present invention mainly includes a base 32, an upper cover 33 connected to the base 32, a supporting member 38 provided with a tube 31, a spring 35 sleeved on the tube 31, a button 34, and a control signal generating assembly 39.

The base 32 defines an opening 36 in a center of the base 32. The supporting member 38 connected to the base 32. The upper cover 33 connected to the base 32 to form a receiving space used to receiving the spring 35, the button 34 and a part of the supporting member 38. The upper cover 33 defines a through hole 331 permitting an operating head 341 of the button 34 to protrude out of the upper cover 33. The button 34 further includes a second plate 371 used to pressed against an upper end of the spring 35, and a post 37 used to be inserted in the tube 31.

The supporting member 38 mainly includes a first plate 381 connected to the base 32 to seal the opening 36, the tube 31 extending substantially perpendicularly from a top surface of the first plate 381 and several (three in the embodiment) blocks 382 extending substantially perpendicularly from the top surface of the first plate 381. A through hole 311 of the tube 31 runs through the first plate 381, therefore an end of the post 37 is capable of inserting in the through hole 311. The blocks 382 is located around the tube 31 and there is a gap 385 between the tube 31 and the blocks 382. A lower part of the spring 35 which is sleeved on the tube 31 is received in the gap 385. Therefore, a movement of the spring 35 is limited by the blocks 382, the keyboard switch is more stable when the button 34 is pressed and released. The supporting member 38 may also connected to the base 32 by rivets mounted in holes formed in the blocks 382 and the base 32, thus the blocks 382 make the connection between the supporting member 38 and the base 32 easier. When a distribution of the blocks 382 is asymmetrical, the blocks 382 can also be used as an indication of the installation direction of the supporting member 38.

The control signal generating assembly 39 is used for generating a switching signal when the button 34 is pressed, and is connected to the base 32 in the embodiment. In the embodiment, the control signal generating assembly 39 includes a first member 391 and a second member 392. The first and the second members 391, 392 are elastic conductive metal sheets. When the button 34 is unpressed, upper parts of the first and the second members 391, 392 contact with each other, therefore a circuit is closed/on. When the button 34 is pressed, two protruding parts (fingers) 372 which extend outwardly from a lower part of the button 34, pushes a lower part of the first member 391 to drive the upper part of the first member 391 to move away from the second member 392, as a result, the first and the second members 391, 392 do not contact with each other anymore, and the circuit is cutoff/open. A control circuit of a keyboard which having the keyboard switch of the embodiment may judge whether the keyboard switch is pressed by the signals outputted by the control signal generating assembly 39.

The supporting member 38 further includes at least one protruding part 386 extending outwardly from the side of the first plate 381, and the base 32 further includes at least one corresponding socket 321 for receiving the at least one protruding part 386. The supporting member 38 may be fixed to the base 32 steadily based on the protruding part 386 and the sockets 321.

In the embodiment, the button 34 cooperates with the tube 31 of the supporting member 38 to switch states of the keyboard switch. The spring 35 is used for driving the button 34 to return to an original position. The tube 31 is located on the supporting member 38, and the supporting member 38 is connected with the base 32 in a split-type manner.

The button 34 moves up and down to separate the first and the second members 391, 392 or let the first and the second members 391, 392 to contact with each other, therefore the two states of the keyboard switch are realized, respectively.

The supporting member 38 and the base 32 are two independent components, so the supporting member 38 and the base 32 may be made of different materials. Since the tube 31 and the button 34 need long-term contact and friction, and the tube 31 has a greater demand for wear resistance and special optical property, the supporting member 38 may be made of materials with wear resistance and good light-shielding property, while the base 32 does not have high requirements for wear resistance and light-shielding property and may be made of other materials. In addition, since the base 32 is used as an appearance, there is a demand for aesthetics. Since the base and the supporting member may be separated from each other independently, the base and the supporting member may be colored in different colors, and may even be made transparent according to needs, thus greatly enriching the space for selecting the design of the shaft body. The split structure of the base and the supporting member enables the base to have more color choices, a fully transparent appearance as required, and more expansion possibilities.

Figure 13:
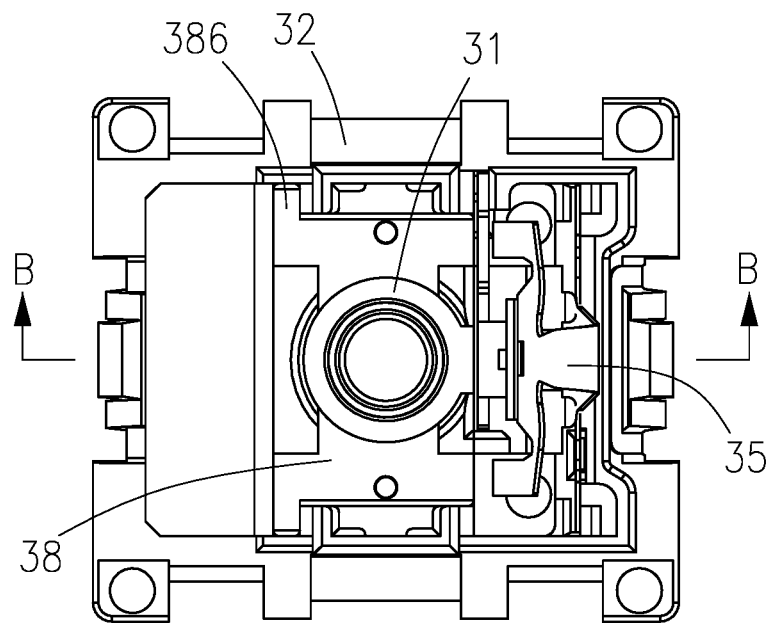
FIG. 13 is a structural view of the base, the supporting member, and the control signal generating assembly in according accordance with the third embodiment of the present invention.
Figure 14:
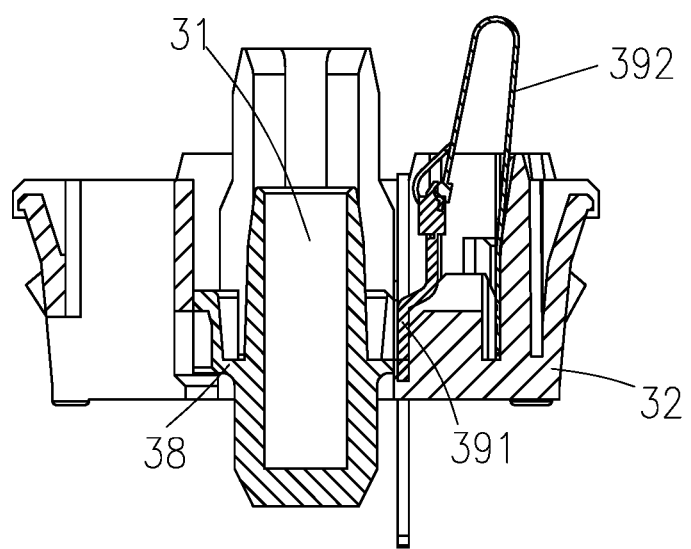
FIG. 14 is a sectional view cutting along a line of B-B of FIG. 13.
Figure 15:
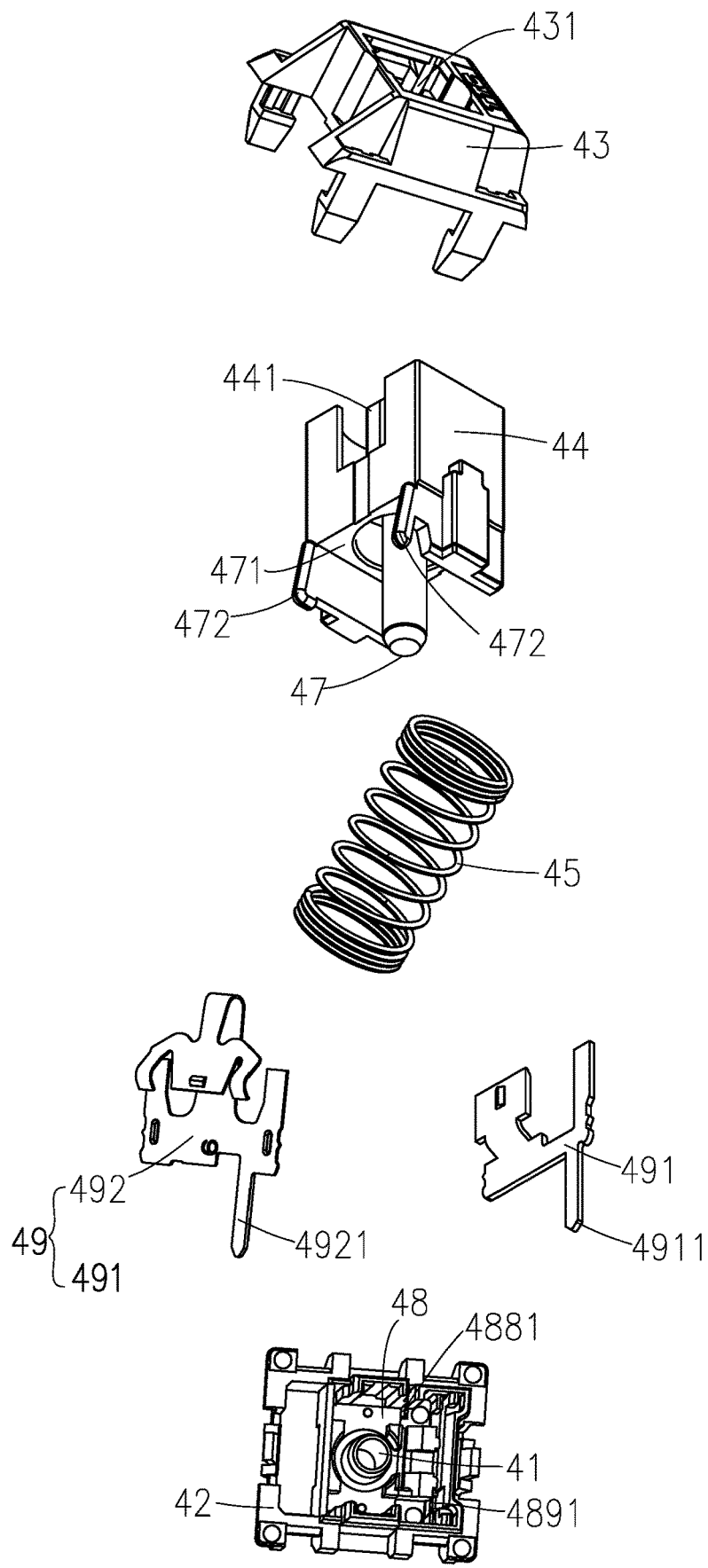
FIG. 15 is an exploded view of a keyboard switch in according accordance with a fourth embodiment of the present invention.
Figure 16:
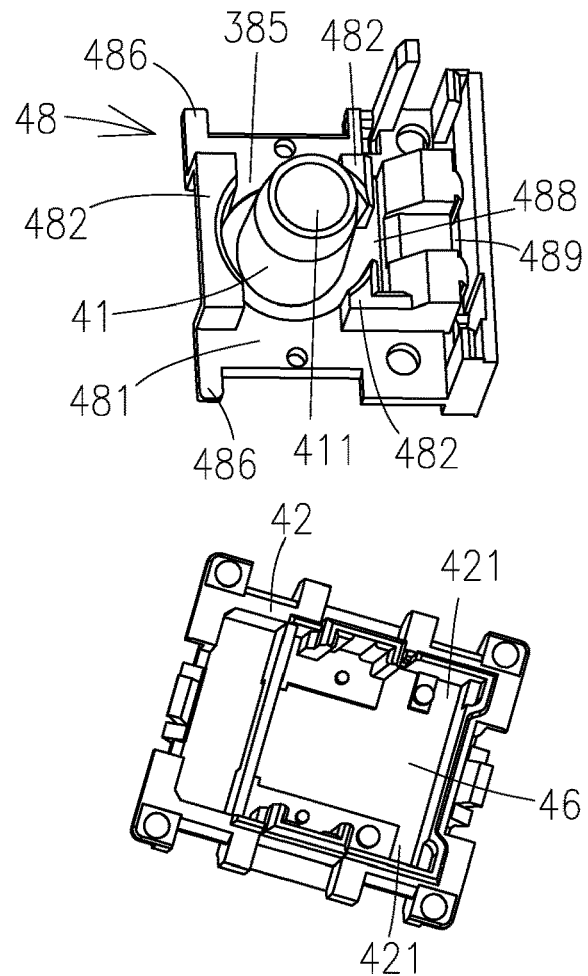
FIG. 16 is a perspective view of a supporting member and a base in according accordance with the fourth embodiment of the present invention.
Figure 17:
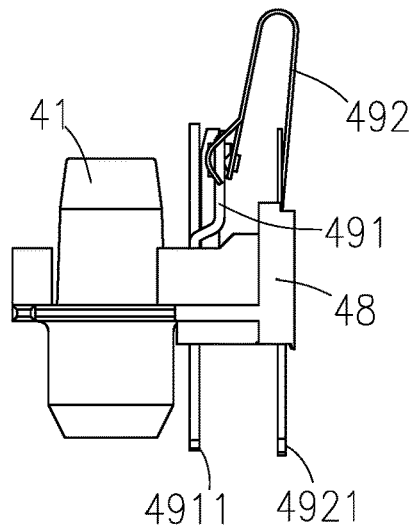
FIG. 17 is a side view of a control signal generating assembly and the supporting member fixed together in according accordance with the fourth embodiment of the present invention.
Figure 18:
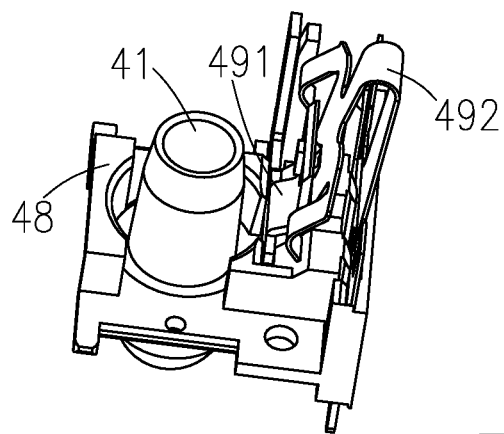
FIG. 18 is a perspective view of the control signal generating assembly and the supporting member fixed together in according accordance with the fourth embodiment of the present invention.
Figure 19:
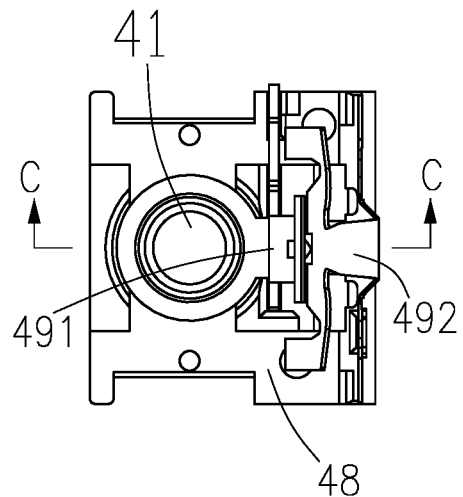
FIG. 19 is a top view of the control signal generating assembly and the supporting member fixed together in according accordance with the fourth embodiment of the present invention.
Figure 20:
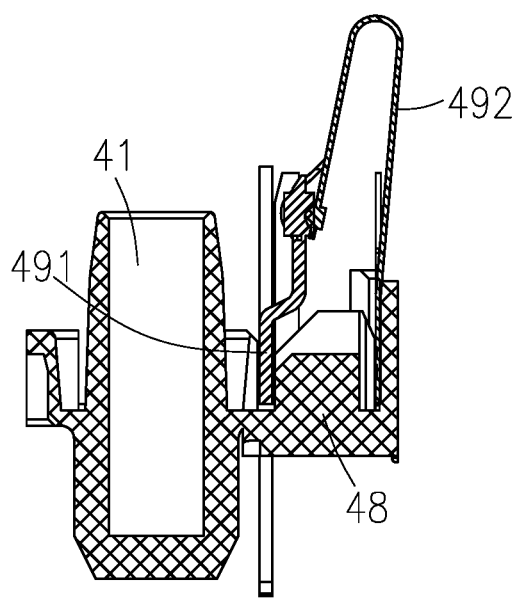
FIG. 20 is a sectional view cutting along a line of C-C of FIG. 19.

As shown in FIG. 13 to FIG. 14, the supporting member 38 is hold tightly within the opening 36 of the base 32. In other embodiments, the supporting member 38 may be connected to the base 32 in a mortise-and-tenon manner, the supporting member may be provided with a tenon, the base may be provided with a mortise, or the supporting member may be provided with a mortise, and the base may be provided with a tenon. In other embodiments, the supporting member may be in an interference connection with the base, and the supporting member and the base may be clamped with each other. In other embodiments, the supporting member may be connected to the base by glue.

Fourth Embodiment

With reference to FIGS. 15-22, a keyboard switch in accordance with a fourth embodiment of the present invention mainly includes a base 42, an upper cover 43 connected to the base 42, a supporting member 48 provided with a tube 41, a spring 45 sleeved on the tube 41, a button 44, and a control signal generating assembly 49.

The base 42 defines an opening 46 in a center of the base 42. The supporting member 48 connected to the base 42. The upper cover 43 connected to the base 42 to form a receiving space used to receiving the spring 45, the button 44 and a part of the supporting member 48. The upper cover 43 defines a through hole 431 permitting an operating head 441 of the button 44 to protrude out of the upper cover 43. The button 44 further includes a second plate 471 used to pressed against an upper end of the spring 45, and a post 47 used to be inserted in the tube 41.

The supporting member 48 mainly includes a first plate 481 connected to the base 42 to seal the opening 46, the tube 41 extending substantially perpendicularly from a top surface of the first plate 481 and several (three in the embodiment) blocks 482 extending substantially perpendicularly from the top surface of the first plate 481. A through hole 411 of the tube 41 runs through the first plate 481, therefore an end of the post 47 is capable of inserting in the through hole 411. The blocks 482 is located around the tube 41 and there is a gap 485 between the tube 41 and the blocks 482. A lower part of the spring 45 which is sleeved on the tube 41 is received in the gap 485. Therefore, a movement of the spring 45 is limited by the blocks 482, the keyboard switch is more stable when the button 44 is pressed and released. The supporting member 48 may also connected to the base 42 by rivets mounted in holes formed in the blocks 482 and the base 42, thus the blocks 482 make the connection between the supporting member 48 and the base 42 easier. When a distribution of the blocks 482 is asymmetrical, the blocks 482 can also be used as an indication of the installation direction of the supporting member 48.

The control signal generating assembly 49 is used for generating a switching signal when the button 44 is pressed, and is connected to the first plate 481 of the supporting member 48 in the embodiment. In the embodiment, the control signal generating assembly 49 includes a first member 491 and a second member 492. The first and the second members 491, 492 are elastic conductive metal sheets. The supporting member 48 includes two sockets 488, 489 for receiving a part of the first and the second members 491, 492. The two sockets 488, 489 define two holes 4881, 4891 in a bottom of the sockets 488, 489. The first member 491 and the second member 492 includes two connecting pins 4911, 4921 respectively. The two connecting pins 4911, 4921 protrude out of the first plate 481 through the two holes 4881, 4891.

When the button 44 is unpressed, upper parts of the first and the second members 491, 492 contact with each other, therefore a circuit is closed/on. When the button 44 is pressed, the button 44 moves down along the tube 41, two protruding parts (fingers) 472 which extend outwardly from a lower part of the button 44, pushes a lower part of the first member 491 to drive the upper part of the first member 491 to move away from the second member 492, as a result, the first and the second members 491, 492 do not contact with each other anymore, and the circuit is cutoff/open. A control circuit of a keyboard which having the keyboard switch of the embodiment may judge whether the keyboard switch is pressed by the signals outputted by the control signal generating assembly 49.

The supporting member 48 further includes at least one protruding part 486 extending outwardly from the side of the first plate 481, and the base 42 further includes at least one corresponding socket 421 for receiving the at least one protruding part 486. The supporting member 48 may be fixed to the base 42 steadily based on the protruding part 486 and the sockets 421.

In the embodiment, the button 44 cooperates with the tube 41 of the supporting member 48 to switch states of the keyboard switch. The spring 45 is used for driving the button 44 to return to an original position. The tube 41 is located on the supporting member 48, and the supporting member 48 is connected with the base 42 in a split-type manner.

The button 44 moves up and down to separate the first and the second members 491, 492 or let the first and the second members 491, 492 to contact with each other, therefore the two states of the keyboard switch are realized, respectively.

The supporting member 48 and the base 42 are two independent components, so the supporting member 48 and the base 42 may be made of different materials. Since the tube 41 and the button 44 need long-term contact and friction, and the tube 41 has a greater demand for wear resistance and special optical property, the supporting member 48 may be made of materials with wear resistance and good light-shielding property, while the base 42 does not have high requirements for wear resistance and light-shielding property and may be made of other materials. In addition, since the base 42 is used as an appearance, there is a demand for aesthetics. Since the base and the supporting member may be separated from each other independently, the base and the supporting member may be colored in different colors, and may even be made transparent according to needs, thus greatly enriching the space for selecting the design of the shaft body. The split structure of the base and the supporting member enables the base to have more color choices, a fully transparent appearance as required, and more expansion possibilities.

Figure 21:
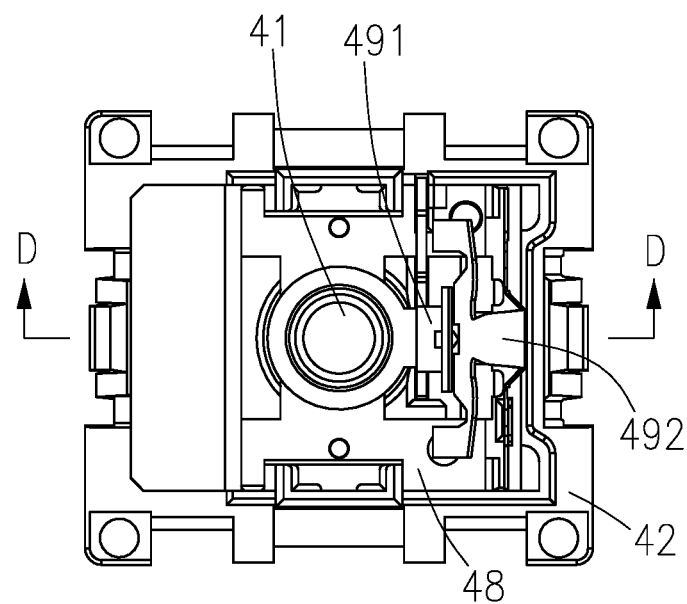
FIG. 21 is a top view of the base, the supporting member and the control signal generating assembly fixed together in according accordance with the fourth embodiment of the present invention.
Figure 22:
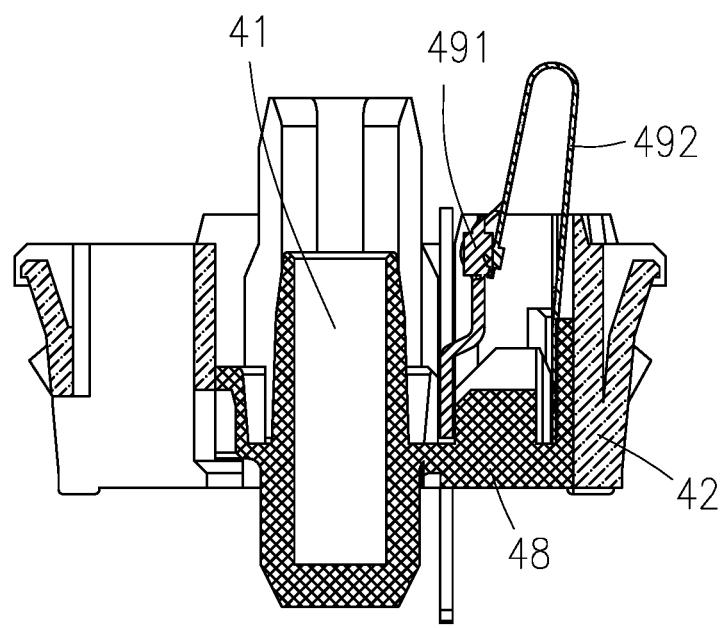
FIG. 22 is a sectional view cutting along a line of D-D of FIG. 21.

As shown in FIG. 21 to FIG. 22, the supporting member 48 is hold tightly within the opening 46 of the base 42. In other embodiments, the supporting member 48 may be connected to the base 42 in a mortise-and-tenon manner, the supporting member may be provided with a tenon, the base may be provided with a mortise, or the supporting member may be provided with a mortise, and the base may be provided with a tenon. In other embodiments, the supporting member may be in an interference connection with the base, and the supporting member and the base may be clamped with each other. In other embodiments, the supporting member may be connected to the base by glue.

While the invention has been described in terms of several exemplary embodiments, those skilled on the art will recognize that the invention can be practiced with modification within the spirit and scope of the appended claims. In addition, it is noted that, the Applicant's intent is to encompass equivalents of all claim elements, even if amended later during prosecution.

What is claimed is:

1. A keyboard switch with a removeable supporting member, comprising:
   a base defining an opening in a center thereof;
   the supporting member, comprising:
   a first plate with its margins removably connected to edges, the edges defining the opening of the base, the first plate being configured for covering the opening; and
   a tube extending substantially perpendicularly from a first surface of the first plate;
   a spring sleeved on the tube;
   a button with a post inserted into the tube and a second plate pressed against an upper end of the spring, the spring being limited between the second plate and the first surface of the first plate;
   an upper cover connected to the base to define a receiving space for the spring and the button; and
   a control signal generating assembly connected to the base or the supporting member, configured for generating a switching signal when the button is pressed to trigger the control signal generating assembly.

2. The keyboard switch according to claim 1, wherein the upper cover defining a through hole permitting an operating head of the button to protrude out of the upper cover.

3. The keyboard switch according to claim 1, wherein the supporting member further comprises a plurality of blocks extending substantially perpendicularly from the first plate and configured around the tube, there is a gap between the tube and the plurality of blocks, a lower part of the spring is configured in the gap.

4. The keyboard switch according to claim 1, wherein the supporting member further comprises at least one protruding part extending outwardly from a side of the first plate, and the base further comprises at least one corresponding socket for receiving the at least one protruding part.

5. The keyboard switch according to claim 1, wherein a through hole of the tube runs through the first plate; the supporting member further comprises two walls extending substantially perpendicularly from a second surface of the first plate and configured on two sides of the through hole of the tube, two slots are defined between the two walls.

6. The keyboard switch according to claim 5, wherein the control signal generating assembly comprises a phototube having an emitter and a collector configured beside the two walls, and the emitter faces the collector through the two slots when the button is unpressed; when the button is pressed and the post is lowered to a position between the emitter and the collector, the collector can't receive light from the emitter.

7. The keyboard switch according to claim 6, wherein at least a lower end of the post of the button is lightproof.

8. The keyboard switch according to claim 1, wherein the control signal generating assembly comprises a first member and a second member mechanically contacting each other and electrically connected with each other when the button is unpressed; when the button is pressed, one of the first member and the second member is moved to be separated from the other one.

9. The keyboard switch according to claim 8, wherein the first member is fixed to the first plate of the supporting member or the base.

10. The keyboard switch according to claim 9, wherein the second member is fixed to the first plate of the supporting member or the base.

11. The keyboard switch according to claim 10, wherein the supporting member comprises two sockets for receiving a part of the first and the second members; the two sockets define two holes in a bottom thereof, and the first member and the second member comprise two connecting pins respectively; the two connecting pins protrude out of the first plate through the two holes.

12. The keyboard switch according to claim 11, wherein the button comprises two fingers protruding outwardly therefrom, and the first member comprises an elastic metal sheet; when the button is pressed, the two fingers push the elastic metal sheet to drive the first member to move away from the second member.

* * * * *